United States Patent
Lee et al.

(10) Patent No.: US 12,147,154 B2
(45) Date of Patent: *Nov. 19, 2024

(54) EUV PHOTO MASKS AND MANUFACTURING METHOD THEREOF

(71) Applicant: TAIWAN SEMICONDUCTOR MANUFACTURING COMPANY, LTD., Hsinchu (TW)

(72) Inventors: Hsin-Chang Lee, Zhubei (TW); Chia-Jen Chen, Jhudong Township (TW); Pei-Cheng Hsu, Taipei (TW); Ta-Cheng Lien, Cyonglin Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/130,262

(22) Filed: Apr. 3, 2023

(65) Prior Publication Data

US 2023/0251563 A1    Aug. 10, 2023

Related U.S. Application Data

(63) Continuation of application No. 17/090,825, filed on Nov. 5, 2020, now Pat. No. 11,619,875.

(60) Provisional application No. 63/045,444, filed on Jun. 29, 2020.

(51) Int. Cl.
G03F 1/24    (2012.01)
G03F 1/54    (2012.01)

(52) U.S. Cl.
CPC . G03F 1/24 (2013.01); G03F 1/54 (2013.01)

(58) Field of Classification Search
CPC ..................................... G03F 1/24; G03F 1/54
USPC ............................................................ 430/5
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,377,679 B2 | 6/2016 | Hamamoto et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 10,712,654 B2 | 7/2020 | Fukaya et al. | |
| 11,204,545 B2 | 12/2021 | Hsu et al. | |
| 11,619,875 B2 * | 4/2023 | Lee | G03F 1/24 430/5 |
| 2013/0260292 A1 | 10/2013 | Yamazaki et al. | |
| 2013/0316272 A1 | 11/2013 | Hayashi et al. | |
| 2014/0356770 A1 | 12/2014 | Hayashi | |
| 2016/0238925 A1 | 8/2016 | Hamamoto et al. | |

FOREIGN PATENT DOCUMENTS

| | | |
|---|---|---|
| DE | 102020102450 A1 | 7/2021 |
| JP | 2011232725 A | 11/2011 |
| JP | 2018180083 A | 11/2018 |
| KR | 1020080001023 A | 1/2008 |
| KR | 1020140004101 A | 1/2014 |
| KR | 1020150037918 A | 4/2015 |
| KR | 1020160002332 A | 1/2016 |
| KR | 1020180103718 A | 9/2018 |
| WO | 2015/041023 A1 | 3/2015 |
| WO | 2020/175354 A1 | 9/2020 |

OTHER PUBLICATIONS

Notice of Allowance issued in U.S. Appl. No. 17/090,825, dated Oct. 24, 2022.

* cited by examiner

*Primary Examiner* — Christopher G Young
(74) *Attorney, Agent, or Firm* — STUDEBAKER & BRACKETT PC

(57) ABSTRACT

In a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer, and the absorber layer is made of Cr, CrO or CrON. The photo resist layer is patterned, the hard mask layer is patterned by using the patterned photo resist layer, the absorber layer is patterned by using the patterned hard mask layer, and an additional element is introduced into the patterned absorber layer to form a converted absorber layer.

20 Claims, 8 Drawing Sheets

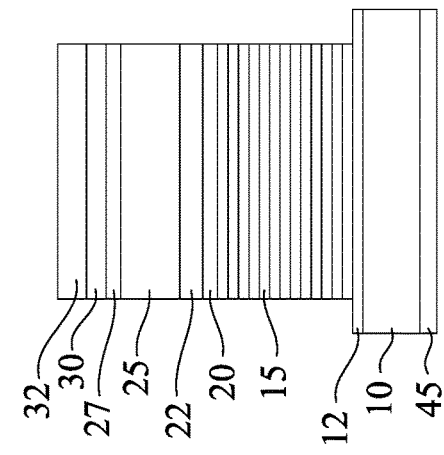
FIG. 1E
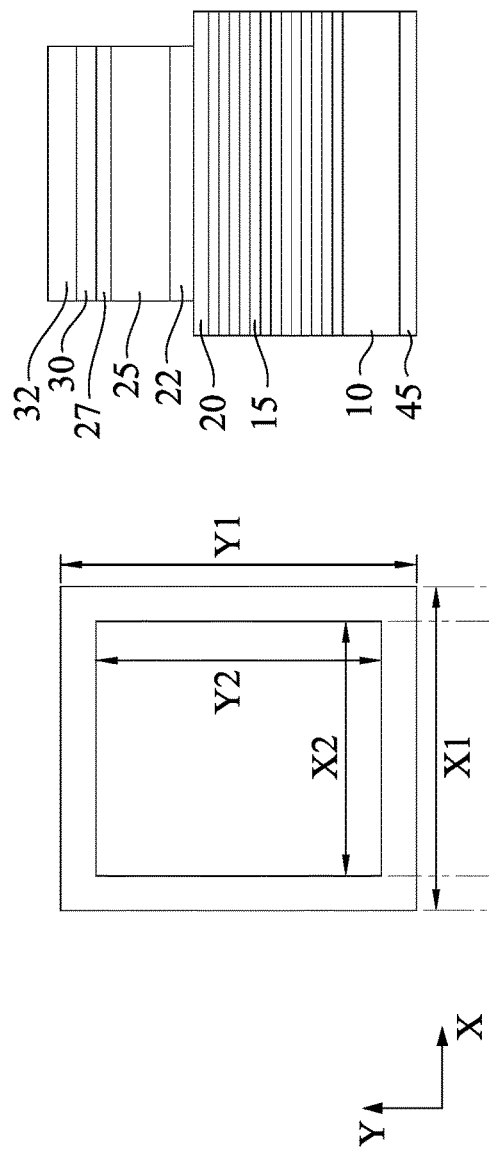
FIG. 1C
FIG. 1D
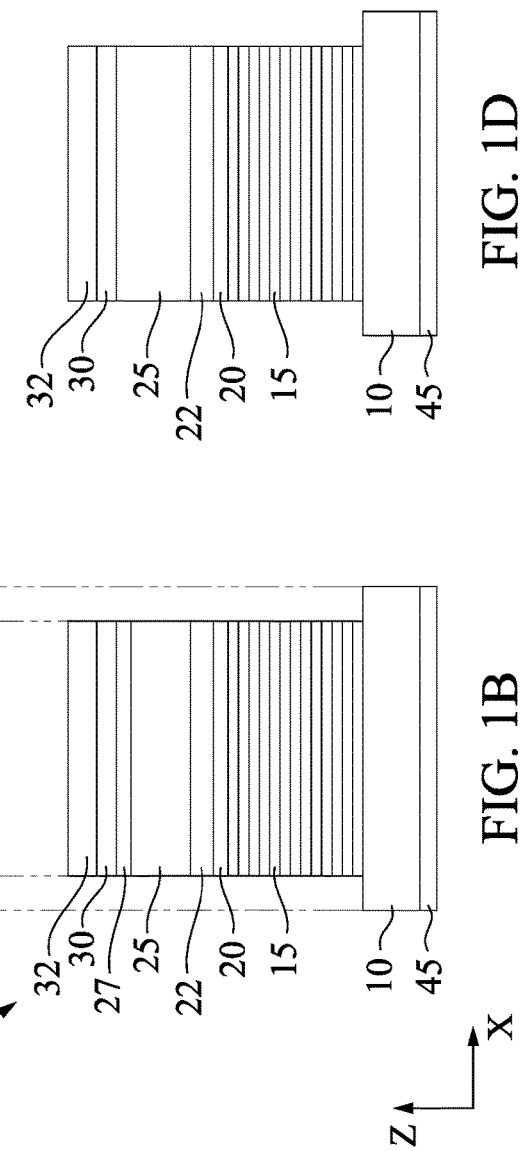
FIG. 1A
FIG. 1B

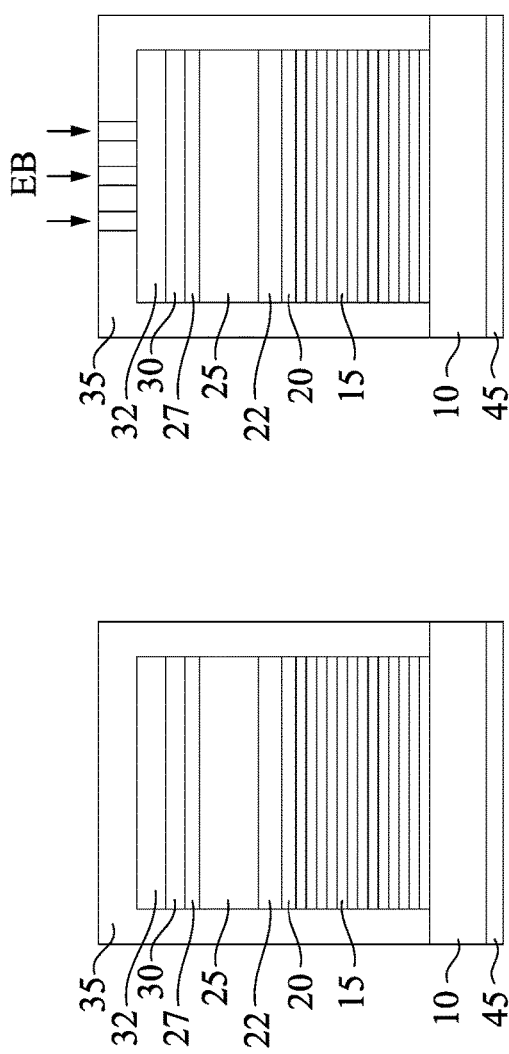
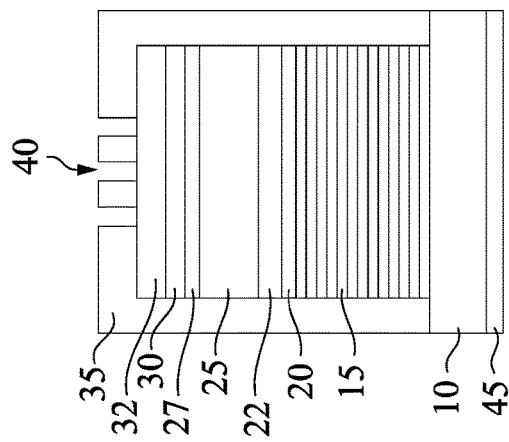
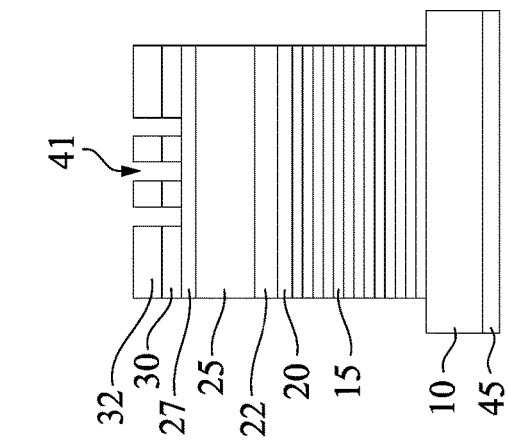
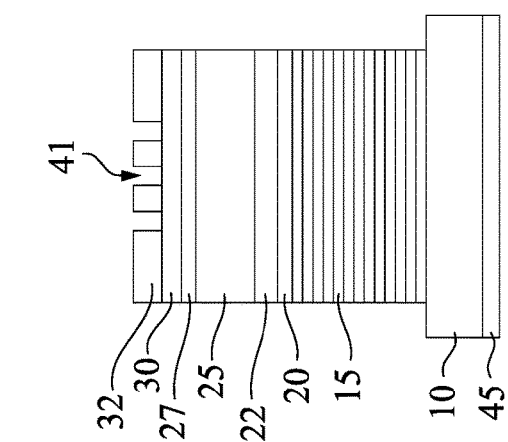
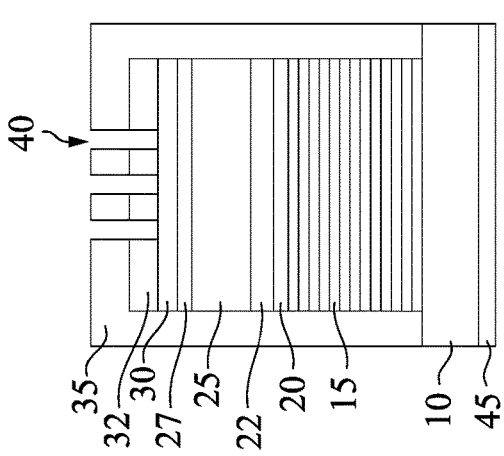
FIG. 2A  FIG. 2B  FIG. 2C  FIG. 2D  FIG. 2E  FIG. 2F

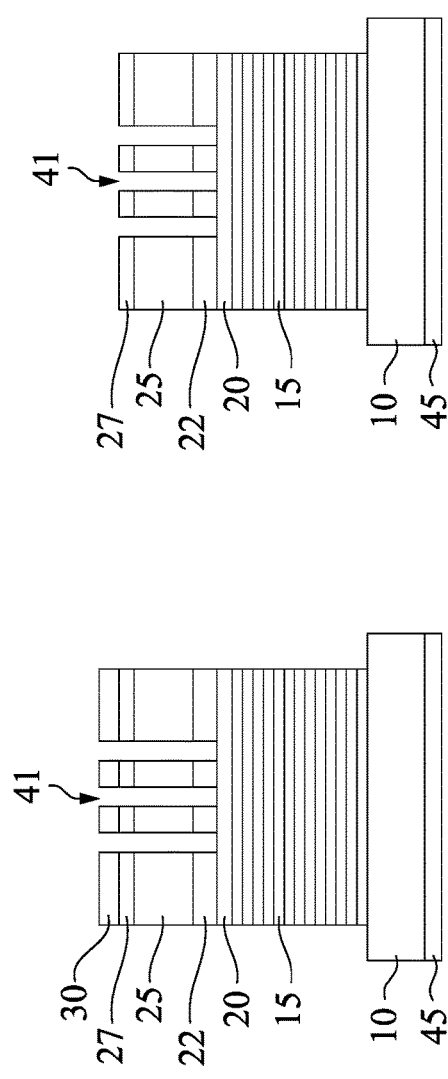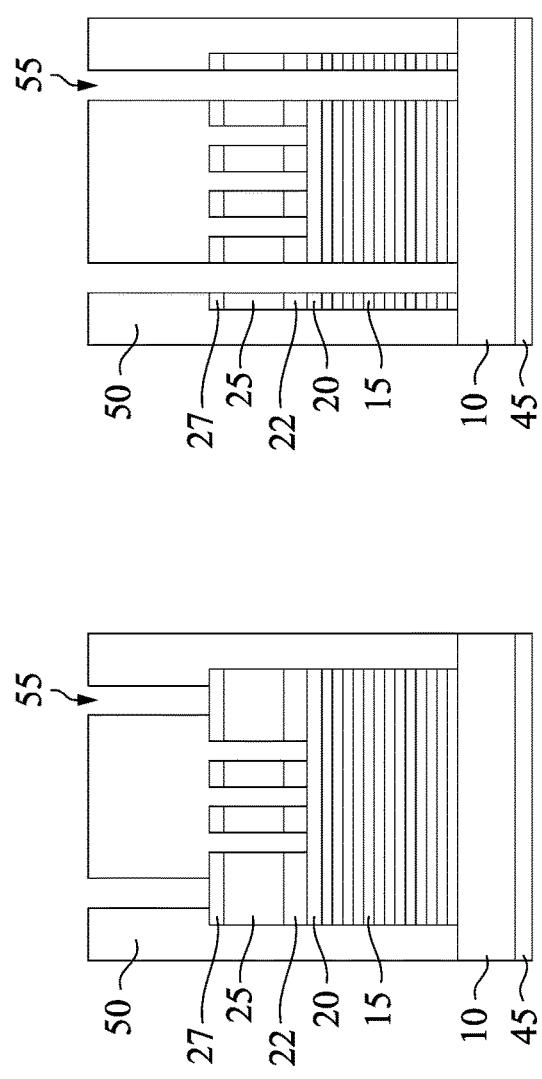

EUV PHOTO MASKS AND MANUFACTURING METHOD THEREOF

RELATED APPLICATIONS

This application is a continuation of U.S. patent application Ser. No. 17/090,825 filed Nov. 5, 2020, now U.S. Pat. No. 11,619,875, which claims priority to U.S. Provisional Patent Application No. 63/045,444 filed on Jun. 29, 2020, the entire contents of each of which are incorporated herein by reference.

BACKGROUND

Photolithography operations are one of the key operations in the semiconductor manufacturing process. Photolithography techniques include ultraviolet lithography, deep ultraviolet lithography, and extreme ultraviolet lithography (EUVL). The photo mask is an important component in photolithography operations. It is critical to fabricate EUV photo masks having a high contrast with a high reflectivity part and a high absorption part.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, 1D and 1E show EUV photo mask blanks according to embodiments of the present disclosure.

FIGS. 2A, 2B, 2C, 2D, 2E and 2F schematically illustrate a method of fabricating an EUV photo mask according to an embodiment of the present disclosure.

FIGS. 3A, 3B, 3C, 3D and 3E schematically illustrate a method of fabricating an EUV photo mask according to an embodiment of the present disclosure.

DETAILED DESCRIPTION

Figure 4:
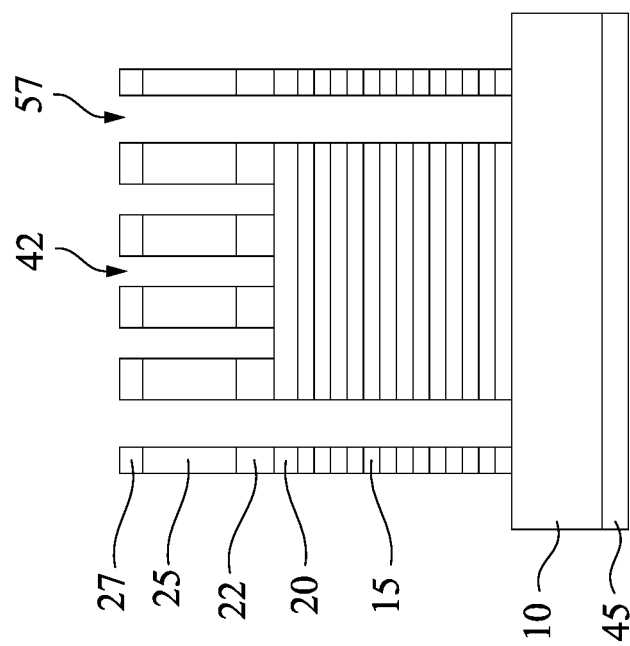
FIG. 4 shows a cross sectional view of an EUV photo mask according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing an EUV photo mask. More specifically, the present disclosure provides techniques to prevent or suppress damage on a backside conductive layer of an EUV photo mask.

EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. Circuit patterns are formed in an absorber layer disposed over the reflective structure. The absorber has a low EUV reflectivity, for example, less than 3-5%.

The present disclosure provides an EUV reflective photo mask having a low reflective (high absorbing) absorber structure.

FIGS. 1A and 1B show an EUV reflective photo mask blank according to an embodiment of the present disclosure. FIG. 1A is a plan view (viewed from the top) and FIG. 1B is a cross sectional view along the X direction.

In some embodiments, the EUV photo mask with circuit patterns is formed from an EUV photo mask blank 5. The EUV photo mask blank 5 includes a substrate 10, a multi-layer Mo/Si stack 15 of multiple alternating layers of silicon and molybdenum, a capping layer 20, a protection layer 22, an absorber layer 25, a first hard mask layer 30 and a second hard mask layer 32. Further, a backside conductive layer 45 is formed on the backside of the substrate 10, as shown in FIG. 1B. In some embodiments, an oxide layer 27 is formed on the top surface of the absorber layer 25 as shown in FIG. 1B. In other embodiments, no oxide layer is formed on the top surface of the absorber layer 25 as shown in FIG. 1D.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size of the substrate 10 is 152 mm×152 mm having a thickness of about 20 mm. In other embodiments, the size of the substrate 10 is smaller than 152 mm×152 mm and equal to or greater than 148 mm×148 mm. The shape of the substrate 10 is square or rectangular.

In some embodiments, the functional layers above the substrate (the multilayer Mo/Si stack 15, the capping layer 20, the protection layer 22, the absorber layer 25, the first hard mask layer 30 and the second hard mask layer 32) have a smaller width than the substrate 10. In some embodiments, the size of the functional layers is in a range from about 138 mm×138 mm to 142 mm×142 mm. The shape of the functional layers is square or rectangular as seen in plan view in some embodiments.

In other embodiments, the protection layer 22, the absorber layer 25, the first hard mask layer 30 and the second hard mask layer 32 have a smaller size, in the range from about 138 mm×138 mm to 142 mm×142 mm, than the substrate 10, the multilayer Mo/Si stack 15 and the capping layer 20 as shown in FIG. 1C. The smaller size of one or more of the functional layers can be formed by using a frame shaped cover having an opening in a range from about 138 mm×138 mm to 142 mm×142 mm, when forming the respective layers by, for example, sputtering. In other embodiments, all of the layers above the substrate 10 have the same size as the substrate 10.

In some embodiments, the Mo/Si multilayer stack 15 includes from about 30 alternating layers each of silicon and molybdenum to about 60 alternating layers each of silicon and molybdenum. In certain embodiments, from about 40 to about 50 alternating layers each of silicon and molybdenum are formed. In some embodiments, the reflectivity is higher than about 70% for wavelengths of interest e.g., 13.5 nm. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each silicon layer is about 4 nm and the thickness of each molybdenum layer is about 3 nm.

In other embodiments, the multilayer stack 15 includes alternating molybdenum layers and beryllium layers. In some embodiments, the number of layers in the multilayer stack 15 is in a range from about 20 to about 100 although any number of layers is allowed as long as sufficient reflectivity is maintained for imaging the target substrate. In some embodiments, the reflectivity is higher than about 70% for wavelengths of interest e.g., 13.5 nm. In some embodiments, the multilayer stack 15 includes about 30 to about 60 alternating layers of Mo and Be. In other embodiments of the present disclosure, the multilayer stack 15 includes about 40 to about 50 alternating layers each of Mo and Be.

The capping layer 20 is disposed over the Mo/Si multilayer 15 to prevent oxidation of the multilayer stack 15 in some embodiments. In some embodiments, the capping layer 20 is made of ruthenium, a ruthenium alloy (e.g., RuNb, RuZr, RuZrN, RuRh, RuNbN, RuRhN, RuV or RuVN) or a ruthenium based oxide (e.g., $RuO_2$, RuNbO, RiVO or RuON), having a thickness of from about 2 nm to about 10 nm. In certain embodiments, the thickness of the capping layer 20 is from about 2 nm to about 5 nm. In some embodiments, the capping layer 20 has a thickness of 3.5 nm±10%. In some embodiments, the capping layer 20 is formed by chemical vapor deposition, plasma-enhanced chemical vapor deposition, atomic layer deposition, physical vapor deposition (e.g., sputtering), or any other suitable film forming method. In other embodiments, a Si layer is used as the capping layer 20.

In some embodiments, a protection (intermediate) layer 22 is formed between the capping layer 20 and the absorber layer 25. The protection layer 22 is for protecting the capping layer 20 in some embodiments. In some embodiments, the protection layer 22 includes a Ta based material, such as TaB, TaO, TaBO or TaBN; silicon; a silicon-based compound (e.g., silicon oxide, SiN, SiON or MoSi); ruthenium; or a ruthenium-based compound (Ru or RuB). The protection layer 22 has a thickness of about 2 nm to about 20 nm in some embodiments. In some embodiments, the protection layer 22 is formed by chemical vapor deposition, plasma-enhanced chemical vapor deposition, atomic layer deposition, physical vapor deposition, or any other suitable film forming method. In some embodiments, the protection layer 22 functions as an etching stop layer during a patterning operation of the absorber layer.

In other embodiments, the intermediate layer 22 is a photo catalytic layer that can catalyze hydrocarbon residues formed on the photo mask into $CO_2$ and/or $H_2O$ with EUV radiation. Thus, an in-situ self-cleaning of the mask surface is performed. In some embodiments, in the EUV scanner system, oxygen and hydrogen gases are injected into the EUV chamber to maintain the chamber pressure (e.g., at about 2 Pa). The chamber background gas can be a source of oxygen. In addition to the photo catalytic function, the photo catalytic layer is designed to have sufficient durability and resistance to various chemicals and various chemical processes, such as cleaning and etching. Ozonated water used to make the EUV reflective mask in a subsequent process may damage the capping layer 20 made of Ru and results in a significant EUV reflectivity drop. Further after Ru oxidation, Ru oxide is easily etched away by an etchant, such as $Cl_2$ or $CF_4$ gas. In some embodiments, the photo catalytic layer includes one or more of titanium oxide ($TiO_2$), tin oxide (SnO), zinc oxide (ZnO) and cadmium sulfide (CdS). The thickness of the photo catalytic layer 22 is in a range from about 2 nm to about 10 nm in some embodiments, and is in a range from about 3 nm to about 7 nm in other embodiments. When the thickness is too thin, the photo catalytic layer may not sufficiently function as an etch stop layer. When the thickness is too large, the photo catalytic layer may absorb the EUV radiation.

The absorber layer 25 is disposed over the intermediate (protection) layer 22. In embodiments of the present disclosure, the absorber layer 25 includes a Cr based material, such as Cr, CrN, CrON and/or CrCON. In the case of CrON or CrCON, a nitrogen amount is in a range from about 10 atomic % to about 30 atomic % in some embodiments. In some embodiments, the absorber layer 25 has a multilayered structure of Cr, CrN, CrON and/or CrCON.

In certain embodiments, a CrN layer is used as the absorber layer 25. When the CrN layer is used, the nitrogen amount is in a range from about 16 atomic % to about 40 atomic % in some embodiments. When the nitrogen amount is in a range from about 16 atomic % to about 30 atomic %, the CrN absorber layer includes Cr and $Cr_2N$ phases. When the nitrogen amount is in a range from about 30 atomic % to about 33 atomic %, the CrN absorber layer substantially consists of a $Cr_2N$ phase (e.g., more than 95 vol %). When the nitrogen amount is in a range from about 33 atomic % to about 40 atomic %, the CrN absorber layer includes $Cr_2N$ and CrN phases. The phases can be observed by an electron energy loss spectroscopy (EELS), a transmission electron microscope (TEM), and/or an X-ray diffraction (XRD) analysis. In some embodiments, the two phases form a solid solution.

In some embodiments, a nitrogen concentration in the absorber layer 25 is not uniform. In some embodiments, the nitrogen concentration is higher in the middle or the center of the absorber layer 25 than a surface region of the absorber layer 25. In some embodiments, the CrN absorber layer includes one or more impurities other than Cr and N in an amount of less than about 5 atomic %. In some embodiments, the absorber layer 25 further includes one or more elements of Co, Te, Hf and/or Ni.

In some embodiments, the thickness of the absorber layer 25 is in a range from about 20 nm to about 50 nm, and is in a range from about 35 nm to about 46 nm in other embodiments.

In some embodiments, an antireflective layer (not shown) is optionally disposed over the absorber layer 25. The antireflective layer is made of a silicon oxide in some embodiments, and has a thickness of from about 2 nm to about 10 nm. In other embodiments, a TaBO layer having a thickness in a range from about 12 nm to about 18 nm is used as the antireflective layer. In some embodiments, the thickness of the antireflective layer is from about 3 nm to about 6 nm. In some embodiments, the antireflective layer is formed by chemical vapor deposition, plasma-enhanced chemical vapor deposition, atomic layer deposition, physical vapor deposition, or any other suitable film forming method.

The oxide layer 27 includes one or more of $Cr_2O_3$ or $CrO_2$ in some embodiments. In some embodiments, the oxide layer 27 is formed during the manufacturing operation of a mask blank. In some embodiments, the thickness of the oxide layer 27 is in a range from about 1 nm to about 3 nm. In some embodiments, as shown in FIG. 1D, no oxide layer is formed.

The first hard mask layer 30 is disposed over the oxide layer 27 in some embodiments. The first hard mask layer 30 is formed over the antireflective layer in some embodiments. In some embodiments, the first hard mask layer 30 is made of a Ta based material, such as TaB, TaO, TaBO or TaBN. In other embodiments, the hard mask layer 30 is made of silicon, a silicon-based compound (e.g., silicon oxide, SiN, SiON or MoSi), ruthenium or a ruthenium-based compound (Ru or RuB). In some embodiments, the first hard mask layer 30 is made of the same or similar material as the protection layer 22. The first hard mask layer 30 has a thickness of about 2 nm to about 20 nm in some embodiments. In some embodiments, the first hard mask layer 30 is formed by chemical vapor deposition, plasma-enhanced chemical vapor deposition, atomic layer deposition, physical vapor deposition, or any other suitable film forming method.

The second hard mask layer 32 is disposed over the first hard mask layer 30 in some embodiments. In some embodiments, the second hard mask layer 32 is made of one or more of GaN, CrON, CrCON, silicon oxide, SiCO and/or yttrium oxide. The second hard mask layer 32 has a thickness of about 2 nm to about 20 nm in some embodiments. The second hard mask layer 32 is smaller or larger than the thickness of the first hard mask layer, in some embodiments. In some embodiments, the second hard mask layer 32 is formed by chemical vapor deposition, plasma-enhanced chemical vapor deposition, atomic layer deposition, physical vapor deposition, or any other suitable film forming method.

In some embodiments, the second hard mask layer 32 is made of a material having a higher etching rate for a plasma including chlorine and oxygen than a material of the first hard mask layer 30. In some embodiments, the first hard mask layer 30 is made of a material having a higher etching rate for a plasma including fluorine than a material of the second hard mask layer 32.

In some embodiments, one or more of the functional layers above the substrate (the multilayer Mo/Si stack 15, the capping layer 20, the protection layer 22, the absorber layer 25, the oxide layer 27, the first hard mask layer 30 and the second hard mask layer 32) have a poly-crystalline structure (e.g., nano-crystalline structure) or an amorphous structure.

In some embodiments, a backside conductive layer 45 is disposed on a second main surface of the substrate 10 opposing the first main surface of the substrate 10 on which the Mo/Si multilayer 15 is formed. In some embodiments, the backside conductive layer 45 is made of TaB (tantalum boride) or other Ta based conductive material. In some embodiments, the tantalum boride is crystalline. The crystalline tantalum boride includes TaB, $Ta_5B_6$, $Ta_3B_4$ and $TaB_2$. In other embodiments, the tantalum boride is poly crystalline or amorphous. In other embodiments, the backside conductive layer 45 is made of a Cr based conductive material (CrN or CrON). In some embodiments, the sheet resistance of the backside conductive layer 45 is equal to or smaller than 20Ω/□. In certain embodiments, the sheet resistance of the backside conductive layer 45 is equal to or more than 0.1Ω/□. In some embodiments, the surface roughness Ra of the backside conductive layer 45 is equal to or smaller than 0.25 nm. In certain embodiments, the surface roughness Ra of the backside conductive layer 45 is equal to or more than 0.05 nm. Further, in some embodiments, the flatness of the backside conductive layer 45 is equal to or less than 50 nm (within the EUV photo mask). In some embodiments, the flatness of the backside conductive layer 45 is more than 1 nm. A thickness of the backside conductive layer 45 is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm. In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

In some embodiments, as shown in FIG. 1E, a substrate protection layer 12 is formed between the substrate 10 and the multilayer stack 15. In some embodiments, the substrate protection layer 12 is made of Ru or a Ru compound, such as RuO, RuNb, RuNbO, RuZr and RuZrO. In some embodiments, the substrate protection layer 12 is made of the same material as or different material from the capping layer 20. The thickness of the substrate protection layer 12 is in a range from about 2 nm to about 10 nm in some embodiments.

FIGS. 2A-2F and 3A-3E schematically illustrate a method of fabricating an EUV photo mask for use in extreme ultraviolet lithography (EUVL). It is understood that additional operations can be provided before, during, and after the processes shown by FIGS. 2A-3E, and some of the operations described below can be replaced or eliminated for additional embodiments of the method. The order of the operations/processes may be interchangeable.

In the fabrication of an EUV photo mask, a first photoresist layer 35 is formed over the second hard mask layer 32 of the EUV photo mask blank as shown in FIG. 2A, and the photoresist layer 35 is selectively exposed to actinic radiation EB as shown in FIG. 2B. Before the first photoresist layer 35 is formed, the EUV photo mask blank is subject to inspection in some embodiments. The selectively exposed first photoresist layer 35 is developed to form a pattern 40 in the first photoresist layer 35 as shown in FIG. 2C. In some embodiments, the actinic radiation EB is an electron beam or an ion beam. In some embodiments, the pattern 40 corresponds to a pattern of semiconductor device features for which the EUV photo mask will be used to form in subsequent operations. In some embodiments, the thickness of the first photo resist layer on the second hard mask layer 32 is in a range from about 500 nm to about 1000 nm.

Next, the pattern 40 in the first photoresist layer 35 is extended into the second hard mask layer 32 forming a pattern 41 in the second hard mask layer 32 exposing portions of the first hard mask layer 32, as shown in FIG. 2D. The pattern 41 extended into the second hard mask layer 30 is formed by etching, in some embodiments, using a suitable wet or dry etchant that is selective to the first hard mask layer 30. In some embodiments, a plasma dry etching operation using a chlorine containing gas (e.g., $Cl_2$, HCl, BCl and $CCl_4$) and an oxygen containing gas (e.g., $O_2$) is used to pattern the second hard mask layer 32. In some embodiments, the material of the first hard mask layer 30 is selected to have a higher etching resistance (lower etching rate) against the plasma dry etching operation using chorine and oxygen, and the etching substantially stops at the first hard mask layer 30. After the pattern 41 in the second hard mask layer 30 is formed, the first photoresist layer 35 is removed by a photoresist stripper to expose the upper surface of the second hard mask layer 32, as shown in FIG. 2E.

Next, the pattern 41 in the second hard mask layer 32 is extended into the first hard mask layer 30 exposing portions of the oxide layer 27, as shown in FIG. 2F. The pattern 41 extended into the first hard mask layer 30 is formed by etching, in some embodiments, using a suitable wet or dry etchant that is selective to the oxide layer 27. In some embodiments, a plasma dry etching operation using a fluorine containing gas (e.g., a fluorocarbon ($CF_4$, $CHF_3$, etc.) and $SF_6$) is used to pattern the first hard mask layer 30. In some embodiments, the material of the absorber layer 27 is selected to have a higher etching resistance (lower etching rate) against the plasma dry etching operation using fluorine, and the etching substantially stops at the oxide layer 27.

Then, the pattern 41 in the first and second hard mask layers 30, 32 is extended into the absorber layer 25 forming a pattern 42 in the absorber layer 25 exposing portions of the intermediate layer 22, as shown in FIG. 3A. The oxide layer 27 and the absorber layer 25 are etched by using a suitable wet or dry etchant that is selective to the first hard mask layer 30 and/or the intermediate layer 22. In some embodiments, a plasma dry etching operation using a chlorine containing gas (e.g., $Cl_2$, HCl, BCl, and $CCl_4$) and an oxygen containing gas (e.g., $O_2$) is used to pattern the absorber layer 25. In some embodiments, the material of the intermediate layer 22 is selected to have a higher etching resistance (lower etching rate) against the plasma dry etching operation using chorine and oxygen, and the etching substantially stops at the intermediate layer 22. In some embodiments, as shown in FIG. 3A, the second hard mask layer 32 is removed during the etching of the oxide layer 27 and the absorber layer 25. In particular, when the second hard mask layer 32 is made of a Cr based material (e.g., CrON or CrCON), the second hard mask layer 32 is removed during the etching of the oxide layer 27 and the absorber layer 25. If the second hard mask layer 32 remains after etching the absorber layer 25, an additional removal operation of the second hard mask layer 32 is performed in some embodiments by using a suitable wet or dry etching.

Then, the first hard mask layer 30 is removed together with a part of the intermediate layer 22 at the bottom of the pattern openings, as shown in FIG. 3B. In some embodiments, the etching is wet etching and/or dry etching. In some embodiments, a plasma dry etching operation using a fluorine containing gas (e.g., a fluorocarbon ($CF_4$, $CHF_3$, etc.) and $SF_6$) is used to remove the first hard mask layer 30 and the intermediate layer 22. In particular, when the first hard mask layer 30 is made of the same or similar material as the intermediate layer 22, the first hard mask layer 30 is removed together with the intermediate layer 22. In some embodiments, the material of the capping layer 20 is selected to have a higher etching resistance (lower etching rate) against the plasma dry etching operation using fluorine, and the etching substantially stops at the capping layer 20.

As shown in FIG. 3C, a second photoresist layer 50 is formed over the oxide layer 27 and the absorber layer 25 filling the pattern 42 in the absorber layer 25. The second photoresist layer 50 is selectively exposed to actinic radiation such as an electron beam, ion beam or UV radiation. The selectively exposed second photoresist layer 50 is developed to form a pattern 55 in the second photoresist layer 50 as shown in FIG. 3C. The pattern 55 corresponds to a black border surrounding the circuit patterns. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments.

Next, the pattern 55 in the second photoresist layer 50 is extended into the oxide layer 27, the absorber layer 25, the optional intermediate layer 22, the capping layer 20, and the Mo/Si multilayer 15 forming a pattern 57 (see, FIG. 3E) in the oxide layer 27, the absorber layer 25, the intermediate layer 22, the capping layer 20, and the Mo/Si multilayer 15 exposing portions of the substrate 10, as shown in FIG. 3D. The pattern 57 is formed by etching, in some embodiments, using one or more suitable wet or dry etchants that are selective to each of the layers that are etched. In some embodiments, plasma dry etching is used.

Then, the second photoresist layer 50 is removed by a suitable photoresist stripper to expose the upper surface of the oxide layer 27 as shown in FIG. 3E. The black border pattern 57 in the oxide layer 27, the absorber layer 25, the intermediate layer 22, the capping layer 20, and the Mo/Si multilayer 15 defines a black border of the photo mask in some embodiments of the disclosure. Further, the photo mask undergoes a cleaning operation, inspection, and the photo mask is repaired as necessary, to provide a finished photo mask.

FIG. 4 shows a cross sectional view of a finished EUV photo mask according to embodiments of the present disclosure. In some embodiments, the EUV photo mask with circuit patterns 42 as shown in FIG. 4 includes a substrate 10, a multilayer Mo/Si stack 15 of multiple alternating layers of silicon and molybdenum, a capping layer 20, a patterned absorber layer 25 and a patterned oxide layer 27. Further, a black border pattern 57 is formed in the oxide layer 27, the absorber layer 25, the intermediate layer 22, the capping layer 20, and the Mo/Si multilayer 15, and a backside conductive layer 45 is formed on the backside of the substrate 10. In some embodiments, the patterned absorber layer 25 includes a CrN layer or a nitrogen rich CrON or CrCON layer with a nitrogen amount is in a range from about 10 atomic % to about 30 atomic % in some embodiments.

Figure 5A:
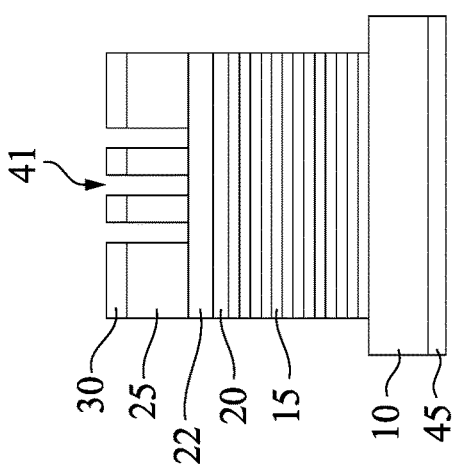
FIGS. 5A, 5B and 5C show cross sectional views of an multilayer structure of an absorber layer according to another embodiment of the present disclosure.
Figure 5B:
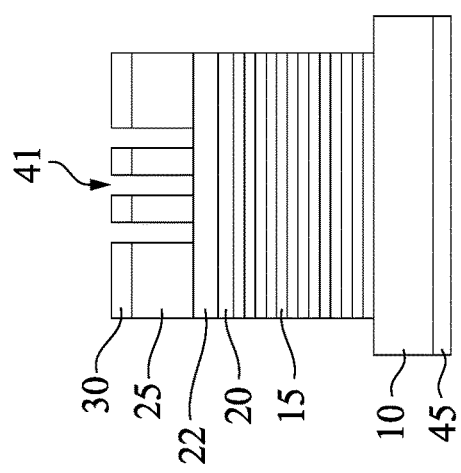
Figure 5C:
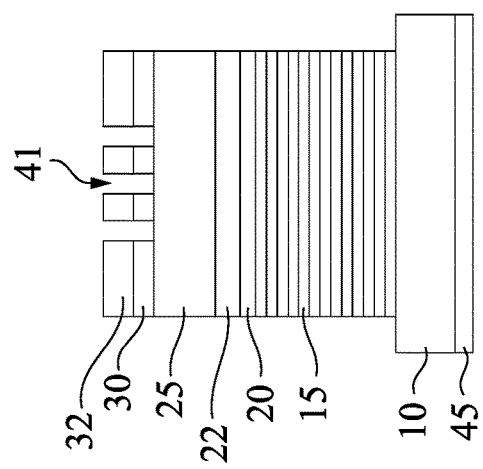

FIGS. 5A, 5B and 5C show cross sectional views of an multilayer structure of an absorber layer according to another embodiment of the present disclosure. It is understood that additional operations can be provided before, during, and after processes shown by FIGS. 2A-3E, and some of the operations described below can be replaced or eliminated, for additional embodiments of the method. The order of the operations/processes may be interchangeable. Materials, configurations, processes and/or dimensions as explained with respect to the foregoing embodiments may be employed in the following embodiments and detailed description thereof may be omitted. The embodiment of FIGS. 5A, 5B and 5C is for a mask blank as shown in FIG. 1D, where no oxide layer is formed on the absorber layer 25. FIG. 5A shows a structure after the hard mask layer 30 is patterned similar to FIG. 2F. The etching of the first hard mask layer 30 substantially stops at the absorber layer 25.

Then, the absorber layer 25 is patterned (etched) by using the patterned first and second hard mask layers as shown in FIG. 5B. In some embodiments, as shown in FIG. 5B, the second hard mask layer 32 is removed during the etching of the absorber layer 25. In some embodiments, when the intermediate layer 22 is made of the same material as or similar material to the first hard mask layer 30, the etching substantially stops at the intermediate layer 22. Then, as shown in FIG. 5C, the first hard mask layer 30 is removed together with a part of the intermediate layer 22 at the bottom of the opening patterns of the absorber layer 25.

Figure 6:
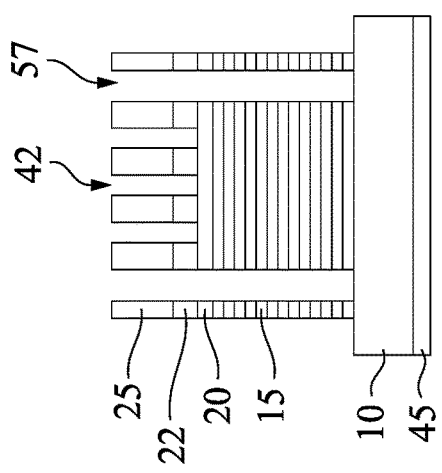
FIG. 6 shows a cross sectional view of an EUV photo mask according to embodiments of the present disclosure.

FIG. 6 shows a cross sectional view of a finished EUV photo mask according to embodiments of the present disclosure. In some embodiments, the EUV photo mask with circuit patterns 42 as shown in FIG. 6 includes a substrate 10, a multilayer Mo/Si stack 15 of multiple alternating layers of silicon and molybdenum, a capping layer 20 and a patterned absorber layer 25. Further, a black border pattern 57 is formed in the absorber layer 25, the capping layer 20, and the Mo/Si multilayer 15, and a backside conductive layer 45 is formed on the backside of the substrate 10. In some embodiments, the patterned absorber layer 25 includes a CrN layer or a nitrogen rich CrON or CrCON layer with a nitrogen amount in a range from about 10 atomic % to about 30 atomic % in some embodiments.

Generally, a Cr based material (CrN, CrON or CrCON) has a high EUV absorption (extinction) coefficient k. For example, CrN has a k-value of 0.0387 which is higher than the k value (0.031) of TaBN and the k value (0.027) of TaBO. Accordingly, it is possible to reduce the thickness of the absorber layer (e.g., from 70 nm of TaBN to 46 nm of CrN), which can suppress three-dimensional effects of the patterned absorber layer. However, a CrN layer or a nitrogen rich CrON or CrCON layer is difficult to etch because of its low etching rate. Thus, directly patterning the CrN layer may cause a poor pattern profile which affects the resolution of EUV lithography. In the present embodiments, two hard mask layers are used to pattern the absorber layer, and since the thickness of the each of the hard mask layers are relatively thin (2-20 nm), it is possible to control the pattern profile of the etched patterns. Thus, it is possible to obtain a good pattern profile with a higher etching rate and a higher EUV absorption coefficient.

Figure 7:
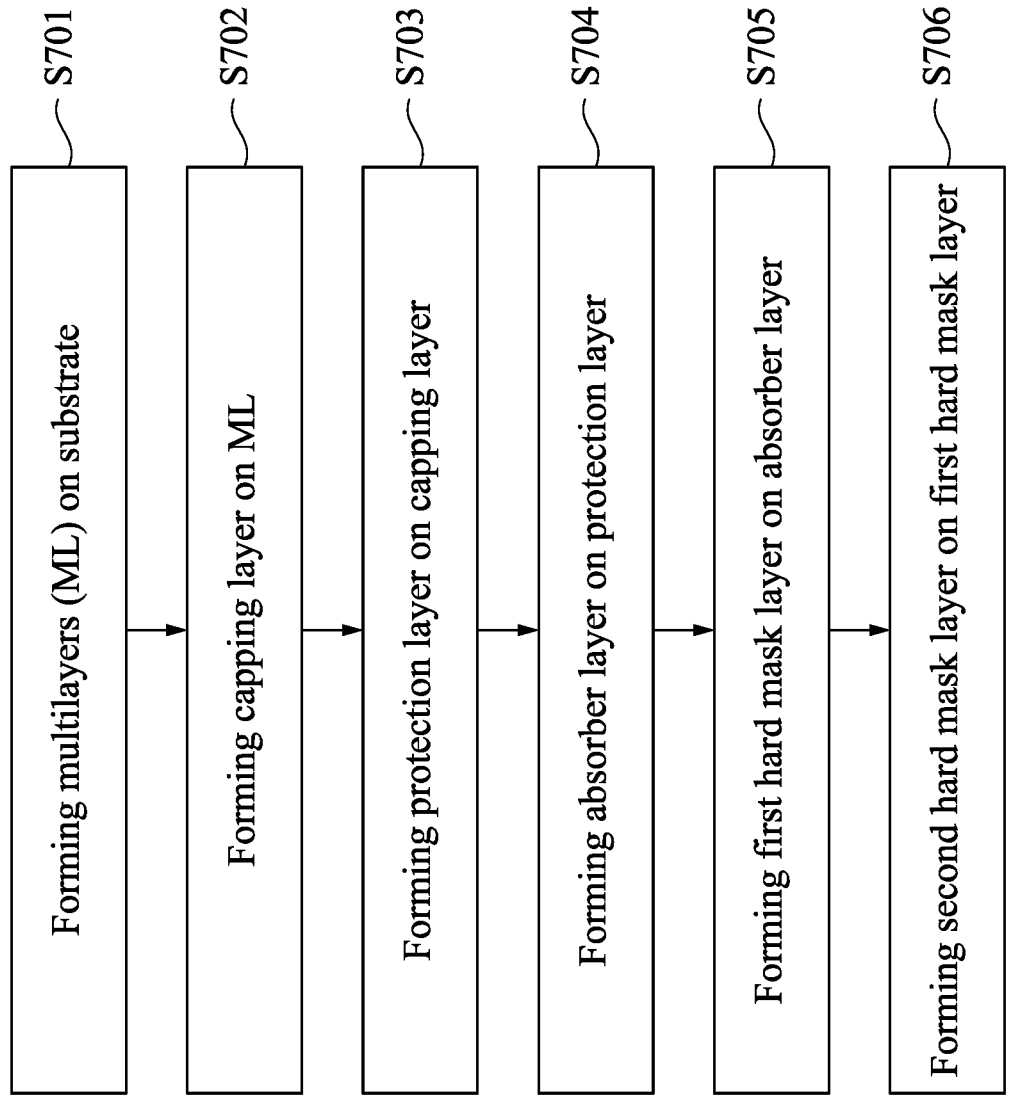
FIG. 7 shows a flow chart of manufacturing a mask blank for an EUV photo mask according to embodiments of the present disclosure.

FIG. 7 shows a flow chart of manufacturing a mask blank for an EUV photo mask according to embodiments of the present disclosure.

In some embodiments, a multilayer stack 15 is formed over a substrate 10 at S701. Then, a capping layer 20 is formed on the multilayer stack 15 at S702, and a protection layer 22 is formed on the capping layer 20 at S703. Next, an absorber layer 25 is formed on the capping layer at S704. Subsequently, a first hard mask layer 30 and a second hard mask layer 32 are formed on the absorber layer at S705 and S706, respectively. In some embodiments, an oxide layer 27 is formed by oxidation after the absorber layer 25 is formed and before the hard mask layers. When the hard mask layers are formed subsequent to the formation of the absorber layer without breaking vacuum, no oxide layer is formed on the top surface of the absorber layer 25 in some embodiments.

Figure 8A:
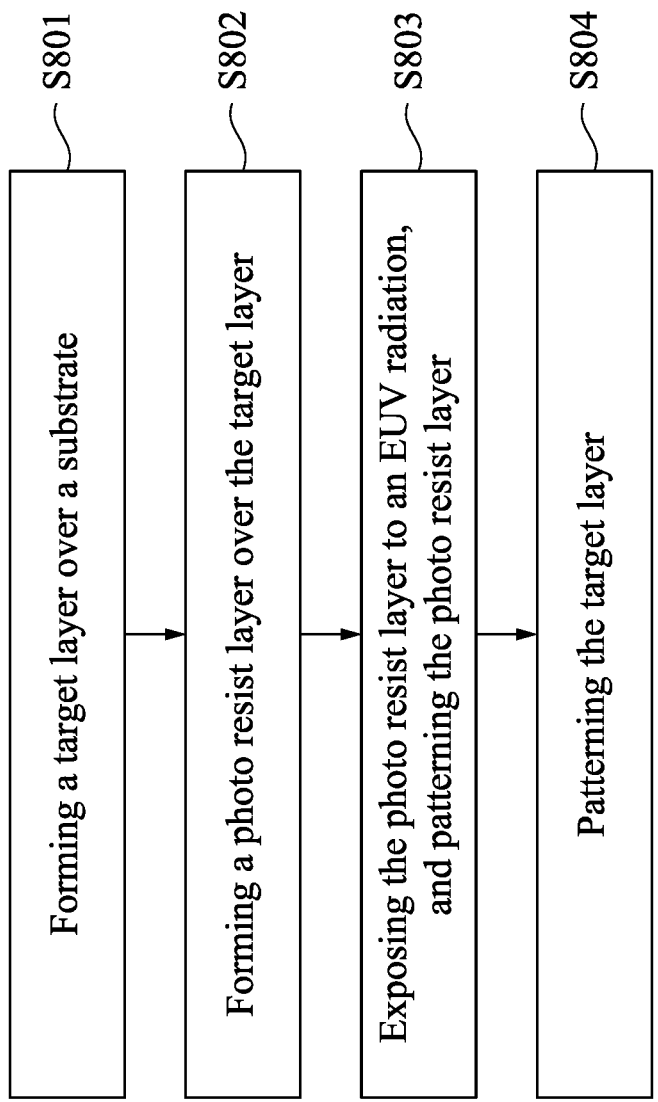
FIG. 8A shows a flowchart of a method making a semiconductor device.
Figure 8B:
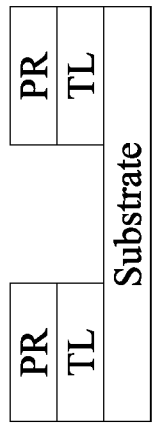
FIGS. 8B, 8C, 8D and 8E show a sequential manufacturing operation of a method of making a semiconductor device in accordance with embodiments of present disclosure.

FIG. 8A shows a flowchart of a method making a semiconductor device, and FIGS. 8B, 8C, 8D and 8E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S801 of FIG. 8A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S802, of FIG. 8A, a photo resist layer is formed over the target layer, as shown in FIG. 8B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S803 of FIG. 8A, the photoresist layer is patterned using an EUV reflective mask as set forth above, as shown in FIG. 8B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

Figure 8D:
Figure 8C:
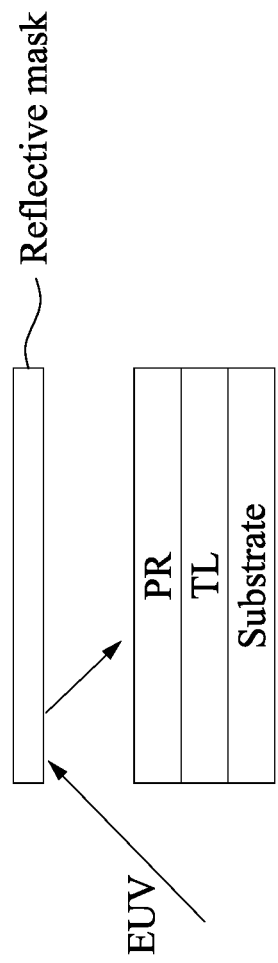
Figure 8E:

At S804 of FIG. 8A, the target layer is patterned utilizing the patterned photoresist layer as an etching mask, as shown in FIG. 8D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 8E.

In the present embodiments, two hard mask layers are used to pattern the absorber layer, and since the thickness of the each of the hard mask layers are relatively thin (2-20 nm), it is possible to control the pattern profile of the etched patterns. Thus, it is possible to obtain a good pattern profile with a higher etching rate and a higher EUV absorption coefficient. Further, since a CrN or nitrogen rich CrON or CrCON layer have a higher EUV absorption coefficient, it is possible to reduce the thickness of the absorber layer, which in turn suppresses three-dimensional effects in the EUV lithography.

It will be understood that not all advantages have been necessarily discussed herein, no particular advantage is required for all embodiments or examples, and other embodiments or examples may offer different advantages. According to one aspect of the present application, a reflective mask includes a substrate, a reflective multilayer disposed on the substrate, a capping layer disposed on the reflective multilayer, and an absorber layer disposed on the capping layer. The absorber layer includes a CrN layer, a CrON layer having a nitrogen concentration of 10 atomic % to 30 atomic % or a CrCON layer having a nitrogen concentration of 10 atomic % to 30 atomic %. In one or more of the foregoing and following embodiments, a thickness of the absorber layer is in a range from 20 nm to 50 nm. In one or more of the foregoing and following embodiments, the absorber layer includes a CrN layer having a nitrogen concentration of 16 atomic % to 40 atomic %. In one or more of the foregoing and following embodiments, the CrN layer includes a Cr phase and a $Cr_2N$ phase. In one or more of the foregoing and following embodiments, the CrN layer consists of a $Cr_2N$ phase. In one or more of the foregoing and following embodiments, the CrN layer includes a $Cr_2N$ phase and CrN phase. In one or more of the foregoing and following embodiments, the reflective mask further includes an intermediate layer disposed on the capping layer. In one or more of the foregoing and following embodiments, the intermediate layer includes at least one of TaB, TaO, TaBO or TaBN, silicon, a silicon-based compound, ruthenium, or a ruthenium-based compound. In one or more of the foregoing and following embodiments, the intermediate layer includes at least one of titanium oxide ($TiO_2$), tin oxide (SnO), zinc oxide (ZnO) or cadmium sulfide (CdS). In one or more of the foregoing and following embodiments, a size of an outer periphery of the absorber layer is smaller than a size of an outer periphery of the substrate in plan view. In one or more of the foregoing and following embodiments, the size of the outer periphery of the absorber layer is in a range from 138 mm×138 mm to 142 mm×142 mm in pan view, and the size of the outer periphery of the substrate is in a range from 148 mm×148 mm to 152 mm×152 mm in plan view.

In accordance with another aspect of the present disclosure, a reflective mask includes a substrate, a reflective multilayer disposed on the substrate, a capping layer disposed on the reflective multilayer, an absorber layer disposed on the intermediate layer, and a Cr oxide layer disposed on the absorber layer. The absorber layer includes a CrN layer, a CrON layer having a nitrogen concentration of 10 atomic % to 30 atomic % or a CrCON layer having a nitrogen concentration of 10 atomic % to 30 atomic %. In one or more of the foregoing and following embodiments, the Cr oxide layer includes $Cr_2O_3$ or $CrO_2$. In one or more of the foregoing and following embodiments, the Cr oxide layer has a thickness in a range from 1 nm to 3 nm. In one or more of the foregoing and following embodiments, the reflective mask further includes an intermediate layer disposed on the capping layer. In one or more of the foregoing and following embodiments, the intermediate layer includes at least one of TaB, TaO, TaBO or TaBN.

In accordance with another aspect of the present disclosure, a reflective mask blank for an EUV mask includes a substrate, a reflective multilayer disposed on the substrate, a capping layer disposed on the reflective multilayer, an intermediate layer disposed on the capping layer, an absorber layer disposed on the capping layer, a first hard mask layer disposed over the absorber layer, and a second hard mask layer disposed on the first hard mask layer. In one or more of the foregoing and following embodiments, the second hard mask layer is made of a material having a higher etching rate for a plasma including chlorine and oxygen than a material of the first hard mask layer. In one or more of the foregoing and following embodiments, the first hard mask layer is made of a material having a higher etching rate for a plasma including fluorine than a material of the second hard mask layer. In one or more of the foregoing and following embodiments, the absorber layer includes a CrN layer, a CrON layer having a nitrogen concentration of 10 atomic % to 30 atomic % or a CrCON layer having a nitrogen concentration of 10 atomic % to 30 atomic %.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an intermediate layer on the capping layer, an absorber layer on the intermediate layer, a first hard mask layer over the absorber layer and a second hard mask layer on the first hard mask layer. The photo resist layer is patterned, the second hard mask layer is patterned by using the patterned photo resist layer, the first hard mask layer is patterned by using the patterned second hard mask layer, and the absorber layer is patterned by using the patterned first hard mask layer and the patterned second hard mask layer. In one or more of the foregoing and following embodiments, in the patterning the second hard mask layer, a first plasma dry etching using a chlorine containing gas and oxygen containing gas is employed. In one or more of the foregoing and following embodiments, the second hard mask layer is made of a material having a higher etching rate in the plasma dry etching than a material of the first hard mask layer. In one or more of the foregoing and following embodiments, in the patterning the absorber layer, a second plasma dry etching using a chlorine containing gas and oxygen containing gas is employed. In one or more of the foregoing and following embodiments, the patterned second hard mask layer is removed during the second plasma dry etching. In one or more of the foregoing and following embodiments, in the patterning the first hard mask layer, a first plasma dry etching using a fluorine containing gas is employed. In one or more of the foregoing and following embodiments, the first hard mask layer is made of a material having a higher etching rate in the plasma dry etching than a material of the second hard mask layer. In one or more of the foregoing and following embodiments, the intermediate layer is patterned by using a second plasma dry etching using a fluorine containing gas, after the absorber layer is patterned. In one or more of the foregoing and following embodiments, the intermediate layer is made of a material having a higher etching rate in the second plasma dry etching than the material of the second hard mask layer. In one or more of the foregoing and following embodiments, the patterned first hard mask layer is removed during the second plasma dry etching.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an intermediate layer on the capping layer, an absorber layer on the intermediate layer, a first hard mask layer over the absorber layer and a second hard mask layer on the first hard mask layer. The photo resist layer is patterned, the second hard mask layer is patterned by using the patterned photo resist layer, the first hard mask layer is patterned by using the patterned hard mask layer, the absorber layer is patterned by using the patterned first hard mask layer and the patterned second hard mask layer, and the first hard mask layer is removed. The second hard mask layer and the absorber layer includes a Cr based compound, and the first hard mask layer and the intermediate layer includes a Ta based compound. In one or more of the foregoing and following embodiments, the second hard mask layer is made of CrON or CrCON, and the absorber layer is made of CrN, CrON having a nitrogen concentration of 10 atomic % to 30 atomic % or CrCON having a nitrogen concentration of 10 atomic % to 30 atomic %. In one or more of the foregoing and following embodiments, the first hard mask layer is made of TaBO, $Ta_2O_5$, $TaO_2$, TaO, or $Ta_2O$, and the intermediate layer is made of TaBO, $Ta_2O_5$, $TaO_2$, TaO, or $Ta_2O$. In one or more of the foregoing and following embodiments, the second hard mask layer is removed during the patterning the absorber layer. In one or more of the foregoing and following embodiments, during the removing the first hard mask layer, part of the intermediate layer is patterned.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an intermediate layer on the capping layer, an absorber layer on the intermediate layer, an oxide layer on the absorber layer, a first hard mask layer on the oxide layer and a second hard mask layer on the first hard mask layer. The photo resist layer is patterned, the second hard mask layer is patterned by using the patterned photo resist layer, the first hard mask layer is patterned by using the patterned second resist layer, the oxide layer and the absorber layer are patterned by using the patterned first hard mask layer and the patterned second hard mask layer, and the intermediate layer is patterned. In one or more of the foregoing and following embodiments, the second hard mask layer and the absorber layer includes a material having a higher etching rate in a plasma dry etching using a chlorine containing gas and an oxygen containing gas than a material of the first hard mask layer and a material of the intermediate layer. In one or more of the foregoing and following embodiments, a thickness of the each of the first and second hard mask layers is in a range from 2 nm to 20 nm. In one or more of the foregoing and following embodiments, the second hard mask layer includes GaN, SiCO or yttrium oxide. In one or more of the foregoing and following embodiments, the oxide layer includes $Cr_2O_3$ or $CrO_2$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reflective mask, comprising:
   a substrate;
   a reflective multilayer disposed on the substrate;
   a capping layer disposed on the reflective multilayer;
   an absorber layer disposed over the capping layer; and
   a Cr oxide layer disposed on the absorber layer,
   wherein the absorber layer includes a CrN layer, a CrON layer having a nitrogen concentration of 10 atomic % to 30 atomic % or a CrCON layer having a nitrogen concentration of 10 atomic % to 30 atomic %.

2. The reflective mask of claim 1, wherein the Cr oxide layer includes $Cr_2O_3$ or $CrO_2$.

3. The reflective mask of claim 1, wherein the Cr oxide layer has a thickness in a range from 1 nm to 3 nm.

4. The reflective mask of claim 1, further comprising an intermediate layer disposed on the capping layer.

5. The reflective mask of claim 4, wherein the intermediate layer includes at least one of TaB, TaO, TaBO or TaBN.

6. The reflective mask of claim 1, wherein a thickness of the absorber layer is in a range from 20 nm to 50 nm.

7. The reflective mask of claim 1, wherein a size of an outer periphery of the absorber layer is smaller than a size of an outer periphery of the substrate in plan view.

8. A reflective mask blank for an EUV mask, comprising:
   a substrate;
   a reflective multilayer disposed on the substrate;
   a capping layer disposed on the reflective multilayer;
   an intermediate layer disposed on the capping layer;
   an absorber layer disposed on the capping layer;
   an oxide layer disposed on the absorber layer;
   a first hard mask layer disposed over the oxide layer; and
   a second hard mask layer disposed on the first hard mask layer.

9. The reflective mask blank of claim 8, wherein the second hard mask layer is made of a material having a higher etching rate for a plasma including chlorine and oxygen than a material of the first hard mask layer.

10. The reflective mask blank of claim 8, wherein the first hard mask layer is made of a material having a higher etching rate for a plasma including fluorine than a material of the second hard mask layer.

11. The reflective mask blank of claim 8, wherein the absorber layer includes a CrN layer, a CrON layer having a nitrogen concentration of 10 atomic % to 30 atomic % or a CrCON layer having a nitrogen concentration of 10 atomic % to 30 atomic %.

12. The reflective mask blank of claim 8, wherein the oxide layer includes $Cr_2O_3$ or $CrO_2$.

13. The reflective mask blank of claim 8, wherein a thickness of the each of the first and second hard mask layers is in a range from 2 nm to 20 nm.

14. The reflective mask blank of claim 8, wherein the second hard mask layer includes GaN, SiCO or yttrium oxide.

15. A method of manufacturing a reflective mask, the method comprising:
forming a photo resist layer over a mask blank, the mask blank including a substrate, a reflective multilayer on the substrate, a capping layer on the reflective multilayer, an intermediate layer on the capping layer, an absorber layer on the intermediate layer, a first hard mask layer over the absorber layer and a second hard mask layer on the first hard mask layer;
patterning the photo resist layer;
patterning the second hard mask layer by using the patterned photo resist layer;
patterning the first hard mask layer by using the patterned second resist layer; and
patterning the absorber layer by using the patterned first hard mask layer and the patterned second hard mask layer.

16. The method of claim 15, wherein the patterning the second hard mask layer comprises a first plasma dry etching using a chlorine containing gas and oxygen containing gas.

17. The method of claim 16, wherein the second hard mask layer is made of a material having a higher etching rate in the plasma dry etching than a material of the first hard mask layer.

18. The method of claim 17, wherein the patterning the absorber layer comprises a second plasma dry etching using a chlorine containing gas and oxygen containing gas.

19. The method of claim 18, wherein the patterned second hard mask layer is removed during the second plasma dry etching.

20. The method of claim 15, wherein the patterning the first hard mask layer comprises a first plasma dry etching using a fluorine containing gas.

* * * * *